United States Patent
Zhang

(10) Patent No.: US 9,711,753 B2
(45) Date of Patent: Jul. 18, 2017

(54) PACKAGING DEVICE AND METHOD FOR MANUFACTURING THE OLED DISPLAY SCREEN

(71) Applicant: SHENZHEN CHINA STAR OPTOELECTRONICS TECHNOLOGY CO., LTD., Shenzhen, Guangdong (CN)

(72) Inventor: Fan Zhang, Guangdong (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 14/647,103

(22) PCT Filed: Jan. 24, 2014

(86) PCT No.: PCT/CN2014/071428
§ 371 (c)(1),
(2) Date: May 25, 2015

(87) PCT Pub. No.: WO2015/109547
PCT Pub. Date: Jul. 30, 2015

(65) Prior Publication Data
US 2016/0322596 A1 Nov. 3, 2016

(30) Foreign Application Priority Data
Jan. 23, 2014 (CN) .......................... 2014 1 0033547

(51) Int. Cl.
*H01L 51/52* (2006.01)
*H01L 21/67* (2006.01)
*H01L 51/56* (2006.01)

(52) U.S. Cl.
CPC .... *H01L 51/5237* (2013.01); *H01L 21/67126* (2013.01); *H01L 51/5253* (2013.01); *H01L 51/56* (2013.01)

(58) Field of Classification Search
CPC ............... B65B 31/02; H01L 21/67126; H01L 51/5237; H01L 51/56
See application file for complete search history.

(56) References Cited

U.S. PATENT DOCUMENTS

| | | | |
|---|---|---|---|
| 6,776,880 B1* | 8/2004 | Yamazaki | C23C 14/568 118/416 |
| 8,753,491 B2* | 6/2014 | Yamazaki | C23C 14/3407 204/192.12 |
| 2015/0230492 A1* | 8/2015 | Day, Jr. | A23F 5/08 426/232 |

* cited by examiner

Primary Examiner — Jaehwan Oh

(57) ABSTRACT

A packaging device for manufacturing the OLED display screen comprises a filling chamber, a transition chamber and a glove box, the glove box is mounted in the filling chamber, a filling pipe is placed in the transition chamber, an isolated cover is provided for separated the transition chamber and the filling chamber, wherein a safe protective cover is further located inside the transition chamber and under the isolated cover, the filling pipe is placed under the safe protective cover in the transition chamber. The touch sensor on the safe protective cover is provided for sensing the position of the filling pipe. If the filling pipe is champed by the safe protective cover, then position of the filling pipe will be readjusted with alarming. The safe protective cover will act a double-protective effect. Then the filling pipe will not be champed by the isolated cover when the filling pipe is replacing.

14 Claims, 1 Drawing Sheet

PACKAGING DEVICE AND METHOD FOR MANUFACTURING THE OLED DISPLAY SCREEN

FIELD OF THE INVENTION

The invention relates to a packaging device and method for manufacturing the display screen, more particularly relates to a packaging device and method for manufacturing the OLED display screen.

BACKGROUND OF THE INVENTION

Nowadays, with the OLED technology developing rapidly, the LCD technology will be displaced by the OLED technology. The packaging technology which is one of OLED key technology becomes a research hotspot.

With the photoelectricity performance, the OLED is necessary to keep in the environment with lower water-oxygen. Especially on the coating process, such as the step moulding and the OLED glue filling process, it is necessary to keep in below 10 ppm environment in the filling chamber. For protecting the water-oxygen environment, saving the filling material and preventing the insert gas blowing out, the filling chamber cannot be often opened. Therefore, the cooperation between the glove box and the transition chamber is very necessary in closing condition.

The transition chamber is provided for connecting the filling chamber and the air. While taking out and putting into the glue from the glove box without opening filling chamber, the sight line in the filling chamber is easy to be resisted. The operation of the glove box is also not easy to be controlled. The glue is usually clamped by the isolated cover of the transition chamber. If these breakdowns appear, then it shall be necessary to open the filling chamber for checking, and so much so that the transition chamber shall be air-bleed constantly to make the filling chamber damaging with negative pressure. Therefore, it is necessary to improve the accessory in the transition chamber for overcome the about disadvantages.

SUMMARY OF THE INVENTION

According to the present disadvantages, the major purpose of the present invention is provided for a packaging device and method for manufacturing the OLED display screen to effectively cut down the water-oxygen value and avoid affecting in the filling chamber by the incorrect operating of the transition chamber, so as to improve the precision and efficiency on the filling glue process.

The present invention is provided for a packaging device for manufacturing the OLED display screen comprising a filling chamber, a transition chamber and a glove box. The glove box is provided for loading the OLED glue which is mounted in the filling chamber. A filling pipe is provided for filling the OLED glue which is placed in the transition chamber. An isolated cover is provided for separated the transition chamber and the filling chamber, wherein a safe protective cover is further located inside the transition chamber and under the isolated cover, the filling pipe is placed under the safe protective cover in the transition chamber.

Preferably, the distance between the safe protective cover and the isolated cover is 4-8 cm. At least one touching sensor mounted on the safe protective cover is provided for measuring whether the safe protective cover is closed tightly or not. A plurality of pressure sensors and water-oxygen sensors mounted on the inwall of the transition chamber and the filling chamber are provided for measuring the pressure value and the water-oxygen value that of. The opening condition of the safe protective cover can be determined according with the pressure difference and the water-oxygen difference between the transition chamber and the filling chamber.

Preferably, two protrudes on the sidewall of the transition chamber are provided for placing the safe protective cover. The safe protective cover can be swimmingly opened and closed with the supporting by the protrudes.

Preferably, a connecting pipe is connecting between the transition chamber and the filling chamber. A vacuum valve and a ventilating valve are mounted on the sidewall of the transition chamber, the transition chamber and the filling chamber can be evacuated by the vacuum value, the inert gas can be filled into the transition chamber and the filling chamber from the ventilating valve.

The present invention is further provided for a packaging method for manufacturing the OLED display screen, wherein comprising the following steps:

Step 1) opening the outer cover of the transition chamber and taking out the replaced filling pipe from the transition chamber, and then closing the safe protective cover and the isolated cover;

Step 2) evacuating the transition chamber and the filling chamber by the vacuum value, and then filling the insert gas into the transition chamber from the ventilating valve, if the pressure difference between the transition chamber and the filling chamber is below 3000 pa and the water-oxygen difference of that is below 10 ppm, then opening the safe protective cover and the isolated cover to fill the OLED glue into the glove box from the filling pipe;

Step 3) closing the isolated cover and the safe protective cover and then filling OLED glue to manufacture the OLED display screen.

Compared with the prior art, the present invention of the packaging device for manufacturing the OLED display screen further comprises a safe protective cover in the filling chamber. The filling pipe is located between the safe protective cover and the outer cover. And there is a distance between the safe protective cover and the isolated cover. The touch sensor on the safe protective cover is provided for sensing the position of the filling pipe. If the filling pipe is champed by the safe protective cover, then position of the filling pipe will be readjusted with alarming. Thus, the filling pipe will be put in right and prevent clamping by the isolated cover to make the filling chamber close untight. The safe protective cover will act a double-protective effect. And then the filling pipe will not be champed by the isolated cover when the filling pipe is replacing, so the follow problems will be prevented, e.g. the filling chamber is evacuated constantly, alarming, blowing, the water and oxygen increasing. And the filling glue will not be polluted with higher water-oxygen value. So the water-oxygen condition in the filling chamber can be effectively controlled and the filling glue and the precision device can be protected preferably.

DETAILED DESCRIPTION OF THE PREFERRED EMBODIMENTS

With the OLED glue having special photoelectric properties, so it is necessary to keep the OLED glue in the lower water-oxygen condition, especially on the coating and adhering process. Such as the moulding step process and filling glue process to mold the OLED display screen with the multi-chamber dispensers, the required precision on the water-oxygen condition will be higher, so it is necessary to keep in below 10 ppm environment in the filling chamber. For keep a lower water-oxygen value on the OLED display screen manufacture and improve the technology precision, the present invention is provided for an advanced packaging device for manufacturing the OLED display screen which can make the isolated cover open normally.

Figure 1:
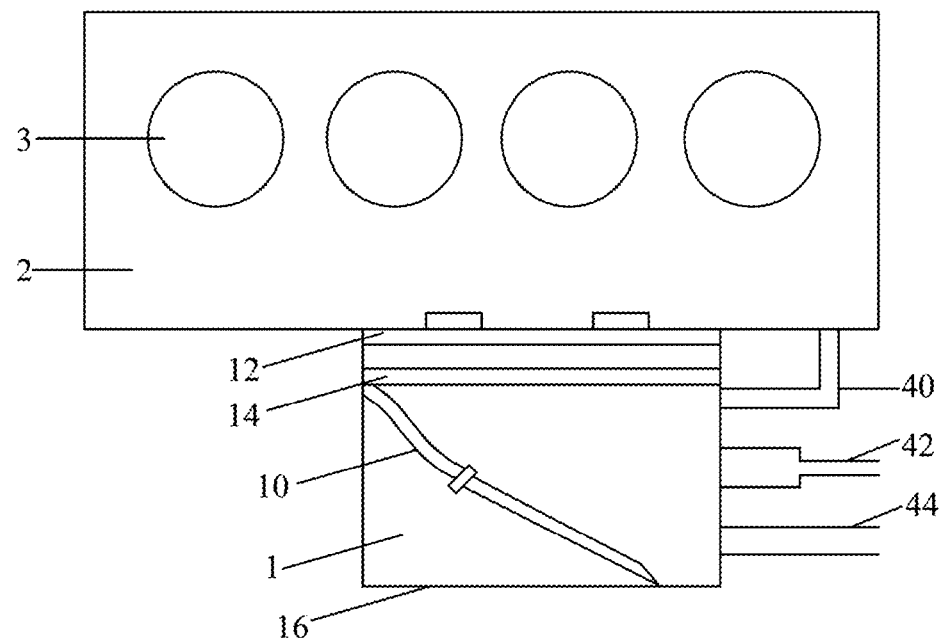
FIG. 1 is a schematic view of the packaging device for manufacturing the OLED display screen according to the present invention.

Referring to FIG. 1, the present invention is provided for a packaging device for manufacturing the OLED display screen comprising a transition chamber 1, a filling chamber 2 and a glove box 3. The glove box 3 is provided for loading the OLED glue which is mounted in the filling chamber 2. A filling pipe 10 is provided for filling the OLED glue which is placed in the transition chamber 1. An isolated cover 12 is provided for separated the transition chamber 1 and the filling chamber 2, wherein a safe protective cover 14 is further located inside the transition chamber 1 and under the isolated cover 12, the filling pipe 10 is placed under the safe protective cover 14 in the transition chamber 1.

The transition chamber 1 is a closeable chamber. The transition chamber 1 comprises an isolated cover 12, a safe protective cover 14 and an outer cover 16. The isolated cover 12 located between the transition chamber 1 and the filling chamber 2 is provided for separating the two chambers to isolate the outer air flow into the filling chamber 2, so as to keep a lower water-oxygen condition in the filling chamber 2. The safe protective cover 14 is located inside the transition chamber 1 and under the isolated cover 12. The isolated cover 12 is parallel to the safe protective cover 14, and the width of two covers is also equally. A distance is provided for between the safe protective cover 14 and the isolated cover 12. Preferably, the distance can be set as 4-8 cm. In the present embodiment, the distance is 5 cm. The outer cover 16 is located at the opposition side of the isolated cover 12. The filling pipe 10 is placed under the safe protective cover 14 in the transition chamber 1, for prevent alarming or even damaging when the filling pipe 10 is clamped by the isolated cover 12.

There are at least one touching sensors 140 are mounted on the safe protective cover 14, which are mounted under the two sides of the safe protective cover 14. On the closing process, the safe protective cover 14 will not be closed tightly if the filling pipe 10 or others are clamped, and then the touch sensor 140 will drive to alarm to warm the operator. So the position of the filling pipe 10 shall be readjusted for renewed closing the safe protective cover 14.

Figure 2:
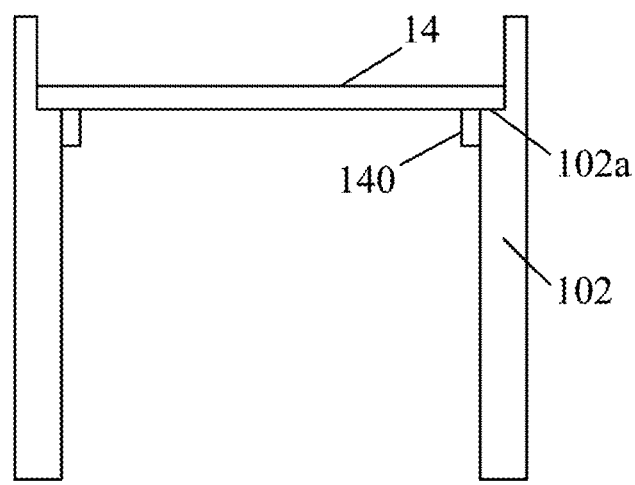
FIG. 2 is a schematic view of the safe protective cover of the packaging device for manufacturing the OLED display screen according to the present invention.

Referring to FIG. 2, two protrudes 102a on the sidewall 102 of the transition chamber 1 are provided for placing the safe protective cover 14. The safe protective cover 14 can be supported by the protrudes 102a. A connecting pipe 40 is provided for circulating which is connecting between the transition chamber 1 and the filling chamber 2. In addition, a vacuum valve 42 and a ventilating valve 44 are mounted on the sidewall of the transition chamber 1, the transition chamber 1 and the filling chamber 2 can be evacuated by the vacuum value 42, the inert gas can be filled into the transition chamber 1 and the filling chamber 2 from the ventilating valve 44. The inert gas can be selected from nitrogen, hydrogen or the mixture gas, wherein the mixture gas is mix with 5 percent nitrogen and 95 percent hydrogen.

A plurality of pressure sensors and water-oxygen sensors are mounted on the inwall of the transition chamber 1 and the filling chamber 2. The pressure sensor is provided for multi-aspectly measuring the atmospheric pressure indoor. And the water-oxygen sensor is provided for multi-aspectly measuring the water-oxygen value. In the present invention, the preset pressure difference between the transition chamber 1 and the filling chamber 2 is below 3000 pa and the preset water-oxygen value difference of that is below 10 ppm. The isolated cover 12 can be opened to get through the transition chamber 1 and the filling chamber 2. When the pressure and the water-oxygen between the two chambers are separated equally, the filling pipe 10 can used to fill glue into the glove box 3.

The present invention is also provided for a packaging method for manufacturing the OLED display screen, wherein comprising the following steps:

Step 1) opening the outer cover of the transition chamber and taking out the replaced filling pipe from the transition chamber, and then closing the safe protective cover and the isolated cover;

Step 2) evacuating the transition chamber and the filling chamber by the vacuum value, and then filling the insert gas into the transition chamber from the ventilating valve, if the pressure difference between the transition chamber and the filling chamber is below 3000 pa and the water-oxygen difference of that is below 10 ppm, then opening the safe protective cover and the isolated cover to fill the OLED glue into the glove box from the filling pipe. If the safe protective cover will not be closed tightly, and then the touch sensor will drive to alarm;

Step 3) closing the isolated cover and the safe protective cover and then filling OLED glue to manufacture the OLED display screen.

In the OLED glue filling process, firstly, the outer cover of the transition cover can be opened and the new filling pipe will be inserted into; secondly, closing the outer cover and evacuating the transition chamber by the vacuum value, then the air will be extracted from the filling chamber through the connecting pipe to make the transition chamber and the filling chamber vacuum; after that, blowing the insert gas into the transition chamber and the filling chamber. With many times blowing, if the pressure difference and the water-oxygen between the two chambers are separated below the preset value, then opening the safe protective cover and the isolated cover to insert the filling pipe into the glove box to fill the OLED glue. Therefore, on the replacing process of the filling pipe and the non-woven fabrics, the air leaking can be prevented produced from the mistake clamping by the isolated cover. So the environment of the filling chamber will not be influenced with the replacing and the position readjusting of the consumptive material. The filling glue and the precise appliance will be protected and the consume of the insert gas will be reduced with reducing the opening times of the filling chamber.

What is claimed is:

1. A packaging device for manufacturing the OLED display screen comprises a filling chamber, a transition chamber and a glove box, the glove box is provided for loading an OLED glue which is mounted in the filling chamber, a filling pipe is provided for filling the OLED glue which is placed in the transition chamber, an isolated cover is provided for separated the transition chamber and the filling chamber, wherein a safe protective cover is further located inside the transition chamber and under the isolated cover, the filling pipe is placed under the safe protective cover in the transition chamber, at least one touching sensors are mounted on the safe protective cover.

2. The packaging device for manufacturing the OLED display screen according to claim 1, wherein two protrudes on a sidewall of the transition chamber are provided for placing the safe protective cover.

3. The packaging device for manufacturing the OLED display screen according to claim 1, the distance between the safe protective cover and the isolated cover is 4-8 cm.

4. The packaging device for manufacturing the OLED display screen according to claim 2, a connecting pipe is connecting between the transition chamber and the filling chamber.

5. The packaging device for manufacturing the OLED display screen according to claim 4, a vacuum valve and a ventilating valve are mounted on the sidewall of the transition chamber, the transition chamber and the filling chamber can be evacuated by the vacuum value, the inert gas can be filled into the transition chamber and the filling chamber from the ventilating valve.

6. The packaging device for manufacturing the OLED display screen according to claim 1, a plurality of pressure sensors are mounted on an inwall of the transition chamber and the filling chamber.

7. The packaging device for manufacturing the OLED display screen according to claim 1, a plurality of water-oxygen sensors are mounted on an inwall of the transition chamber and the filling chamber.

8. A packaging device for manufacturing the OLED display screen comprises a filling chamber, a transition chamber and a glove box, the glove box is provided for loading an OLED glue which is mounted in the filling chamber, a filling pipe is provided for filling the OLED glue which is placed in the transition chamber, an isolated cover is provided for separated the transition chamber and the filling chamber, wherein a safe protective cover is further located inside the transition chamber and under the isolated cover, the filling pipe is placed under the safe protective cover in the transition chamber.

9. The packaging device for manufacturing the OLED display screen according to claim 8, wherein at least one touching sensors are mounted on the safe protective cover.

10. The packaging device for manufacturing the OLED display screen according to claim 9, wherein two protrudes on a sidewall of the transition chamber are provided for placing the safe protective cover.

11. The packaging device for manufacturing the OLED display screen according to claim 8, wherein the distance between the safe protective cover and the isolated cover is 4-8 cm.

12. The packaging device for manufacturing the OLED display screen according to claim 9, wherein a connecting pipe is connecting between the transition chamber and the filling chamber.

13. The packaging device for manufacturing the OLED display screen according to claim 12, wherein a vacuum valve and a ventilating valve are mounted on the sidewall of the transition chamber, the transition chamber and the filling chamber can be evacuated by the vacuum value, the inert gas can be filled into the transition chamber and the filling chamber from the ventilating valve.

14. The packaging device for manufacturing the OLED display screen according to claim 8, wherein a plurality of pressure sensors and water-oxygen sensors are mounted on an inwall of the transition chamber and the filling chamber.

\* \* \* \* \*